US008580695B2

(12) United States Patent
Liu

(10) Patent No.: US 8,580,695 B2
(45) Date of Patent: Nov. 12, 2013

(54) METHOD OF FABRICATING A SEMICONDUCTOR DEVICE

(75) Inventor: Huanxin Liu, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 157 days.

(21) Appl. No.: 13/310,624

(22) Filed: Dec. 2, 2011

(65) Prior Publication Data

US 2013/0040462 A1 Feb. 14, 2013

(30) Foreign Application Priority Data

Aug. 10, 2011 (CN) .............................. 2011 1 022768

(51) Int. Cl.
*H01L 21/302* (2006.01)
(52) U.S. Cl.
USPC ........... 438/745; 438/285; 438/719; 438/303; 438/298; 257/57
(58) Field of Classification Search
USPC ............. 134/3; 216/27; 257/57, 622, 708, 77; 385/14; 428/195.1; 438/198, 285, 298, 438/303, 689, 696, 700, 719, 745; 73/105
See application file for complete search history.

(56) References Cited

U.S. PATENT DOCUMENTS 8,372,722 B2 * 2/2013 Wei et al. ...................... 438/298

OTHER PUBLICATIONS

Kazuo Sato et al., Surfactant Adsorption on Single-Crystal Silicon Surfaces in TMAH Solution: Orientation-Dependent Adsorption Detected by In Situ Infrared Spectroscopy, Journal of Microelectromechanical systems, vol. 18, No. 6, Dec. 2009, pp. 1345-1356.*

* cited by examiner

*Primary Examiner* — Duy Deo
*Assistant Examiner* — Erin Bergner
(74) *Attorney, Agent, or Firm* — Koppel, Patrick, Heybl & Philpott; Michael J. Ram

(57) ABSTRACT

A method of fabricating a semiconductor device for improving the performance of "Σ" shaped embedded source/drain regions is disclosed. A "U" shaped recess is formed in a Si substrate. The recess is treated with a surfactant, the amount of surfactant adsorbed on the recess sidewalls being greater than that on the recess bottom. An oxide is formed on the bottom. The presence of surfactant on the sidewalls, prevents oxide from forming thereon. The surfactant on the sidewalls is then removed and an orientation selective wet etching process is performed on the sidewalls. The oxide protects the Si at the bottom is from being etched.

14 Claims, 5 Drawing Sheets

METHOD OF FABRICATING A SEMICONDUCTOR DEVICE

CROSS-REFERENCE TO RELATED APPLICATIONS

This application claims priority to Chinese Patent Application No. 201110227768.9, filed on Aug. 10, 2011 and entitled "Method of fabricating A semiconductor device", which is incorporated herein in its entirety by reference.

BACKGROUND OF THE INVENTION

1. Field of the Invention

The present invention relates to a method of fabricating a semiconductor device, and particularly to a method of fabricating a semiconductor device having "Σ" shaped embedded source/drain regions.

2. Description of the Related Art

The development of semiconductor techniques follows Moore's law, with gradually reduced critical size. A technique of embedding SiGe in recessed source/drain regions to improve channel mobility for PMOS devices has been proposed. Since SiGe has a lattice constant larger than that of Si, it can provide a compressive stress on the channel region of a PMOS device from source to drain regions, consequently enhancing hole mobility for the PMOS device.

In order to enhance the effect of stress application, a scheme of forming a "Σ" shaped recess for filling with SiGe is proposed herein.

FIG. 1 schematically illustrates a "Σ" shaped recess formed in a substrate. In this figure, a "Σ" shape is formed in the substrate 100, below the surface 130 if the substrate 100 comprising the upper portion 140 and the lower portion 150 of the recess sidewall and above the extended line 160 (denoted by a dashed line) of the recess bottom 180.

The "Σ" shaped recess shown in FIG. 1, for example, can be formed through the following method.

A substrate 100 having a surface with a (001) plane orientation can be selected. As shown in FIG. 2A, first, a "U" shaped recess 210 having a bottom with the (001) plane orientation can be formed in the substrate through, for example, dry etching. The sidewalls of recess 210 then can have a (110) plane orientation.

Next, a wet etchant having orientation selectivity, such as an etchant comprising Tetramethyl ammonium hydroxide (TMAH), is utilized to etch the substrate 200 from the "U" shaped recess 210. During the etching process, the etch rate on the <100> orientation is lower than that on the <110> orientation, and the etch rate on a <111> orientation is far less than that on the <100> orientation. Thus, the "U" shaped recess 210 is etched to form a diamond-shaped recess 215, as shown in FIG. 2B. The location of the original "U" shaped recess 210 is illustrated by a dashed line. The sidewalls of recess 215 have an upper portion 240 which has substantially the (111) crystal plane orientation and a lower portion 250 which has substantially the (11$\bar{1}$) crystal plane orientation.

However, since the etch rate on the <100> and <110> orientations is larger than that on the <111> orientation, the flat bottom 260 of the recess 215 is liable to be etched to a cuspate shape as shown in FIG. 2B. If SiGe is epitaxially grown at the cuspate bottom of the recess 215, high-quality SiGe can not be obtained.

SUMMARY OF THE INVENTION

An object of the present invention is to provide a method of fabricating a semiconductor device, capable preventing the occurrence of a cuspate bottom when forming a "Σ" shaped recess.

According to a first aspect of the present invention, there is provided a method of fabricating semiconductor devices, comprising: forming a substantially "U" shaped recess in a Si substrate; treating the "U" shaped recess with a surfactant, wherein an amount of surfactant adsorbed on sidewalls of the "U" shaped recess is larger than an amount adsorbed on a bottom of the "U" shaped recess; forming an oxide on the bottom of the "U" shaped recess, wherein the surfactant adsorbed on the sidewalls of the "U" shaped recess prevents the oxide from being formed on the sidewalls; removing the surfactant on the sidewalls of the "U" shaped recess using a first cleaning agent; performing orientation selective wet etching on the sidewalls of the "U" shaped recess with an etchant using the oxide as an etching stop layer, so as to form a "Σ" shaped recess; and removing the oxide on the bottom of the "U" shaped recess using a second cleaning agent.

Preferably, the step of treating the "U" shaped recess with a surfactant may comprise: covering the sidewalls and bottom of the "U" shaped recess with the surfactant; and removing the surfactant covering the sidewalls and bottom of the "U" shaped recess with a third cleaning agent.

Preferably, the surfactant may comprise Triton X-100.

Preferably, the third cleaning agent may comprise deionized water.

Preferably, the oxide can be obtained through treating the Si substrate with peroxide or low concentration ozone water.

Preferably, the peroxide may comprise SC1 (SC-1 is an abbreviation recognized in the art for Standard Clean Solution #1. Its name is derived from the original wafer cleaning process developed at RCA laboratories in 1970) composed of ammonia, hydrogen peroxide and deionized water with a volume ratio of 1:2:50, wherein the mass concentration of ammonia is 29% and the mass concentration of hydrogen peroxide is 31%.

Preferably, the first cleaning agent may comprise N-methyl-2-pyrrolidone (NMP).

Preferably, the etchant has a higher etch rate with respect to Si as compared to the oxide.

Preferably, the etchant may comprise tetramethylammonium hydroxide (TMAH).

Preferably, the second cleaning agent may comprise diluted HF.

Preferably, the method may further comprise: filling the "Σ" shaped recess through SiGe epitaxial growth in the "Σ" shaped recess.

Preferably, the SiGe filled in the "Σ" shaped recess is used to form a source or drain region of a PMOS device.

Preferably, either of the plane orientations of the substrate surface and the sidewalls of the "U" shaped recess is substantially one of two crystal planes substantially orthogonal to each other among {100} and {110} crystal plane families, and in the orientation selective wet etching, the etch rate on the <100> orientation is lower than that on <110> orientation, and the etch rate on the <111> orientation is far lower than that on <100> orientation.

Preferably, the substrate surface has (001) plane orientation, and the sidewalls of the "U" shaped recess has (110) plane orientation.

An advantage of the present invention is that the Si at the bottom of the recess can be prevented from being etched in the wet etching process, thus avoiding the occurrence of a cuspate bottom when forming the "Σ" shaped recess.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention will be more clearly understood from the following detailed description with reference to the accompanying drawings.

DESCRIPTION OF THE EMBODIMENTS

Figure 1:
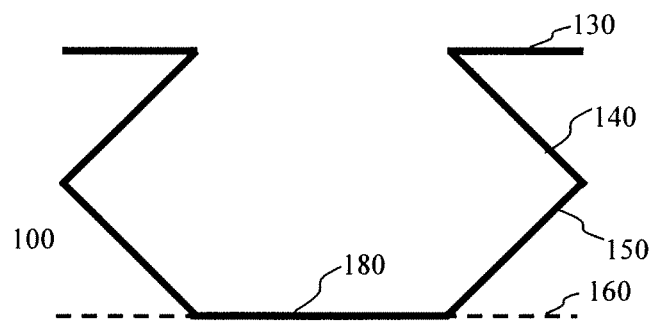
FIG. 1 is a diagram schematically showing a "Σ" shaped recess.
Figure 2A:
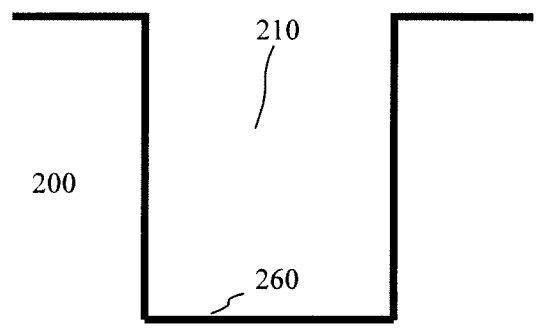
FIGS. 2A and 2B are diagrams schematically showing various prior art steps of a process of forming a "Σ" shaped recess.
Figure 2B:
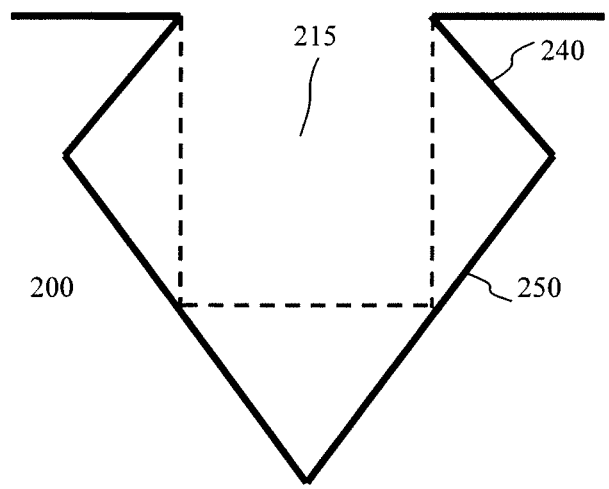

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

At the same time, it should be appreciated that for the simplicity of description, each part in these figures may not be drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

It should be noticed that similar reference numerals and letters refer to similar items in the following figures, and thus once an item is defined in one figure, it is possible that it need not be further discussed for following figures.

As well known in the art, the {100} crystal plane family comprises the (100), (010), (001) crystal planes, the {110} crystal plane family comprises the (110), (101), (011), (1$\bar{1}$0), (10$\bar{1}$) and (01$\bar{1}$) crystal planes, and the {111} crystal plane family comprises the (111), (1$\bar{1}$1) and (11$\bar{1}$) crystal planes.

As well known in the art, the <100> crystal orientation family comprises the [100], [010] and [001] crystal orientations, the <110> crystal orientation family comprises the [110], [101 ], [011], [1$\bar{1}$0], [10$\bar{1}$] and [01$\bar{1}$] crystal orientations, and the <111> crystal orientation family comprises the [111], [$\bar{1}$11], [1$\bar{1}$1] and [11$\bar{1}$] crystal orientations. For the convenient of description, in this application, "crystal orientation family" is called as "crystal orientation" for short. For example, the "<111> crystal orientation" refers to the "<111> crystal orientation family".

The method of fabricating a semiconductor device according to the present invention is discussed below with reference to the diagrams of various steps of the process shown in FIGS. 3A to 3G and the flowchart shown in FIG. 4.

Semiconductor devices, especially CMOS devices, usually contain not only NMOS but also PMOS devices.

Source region or drain region formed of embedded SiGe is usually used in PMOS devices. Hence, before the implementation of each step discussed below, portions to be used for forming NMOS devices should be covered with a mask to expose merely those portions to be used for forming PMOS devices, and consequently, recesses are merely formed in those portions to be used for forming PMOS devices and filled with embedded SiGe therein.

Figure 3A:
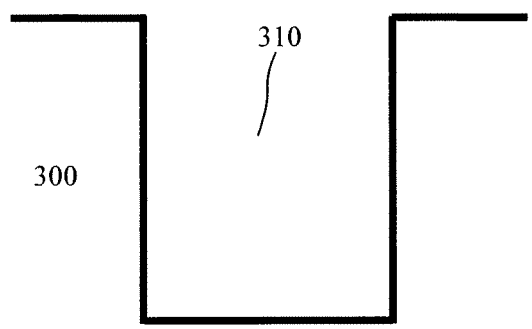
FIGS. 3A to 3G are diagrams schematically showing various steps of a method of fabricating the semiconductor device incorporation features of the invention.
Figure 3B:
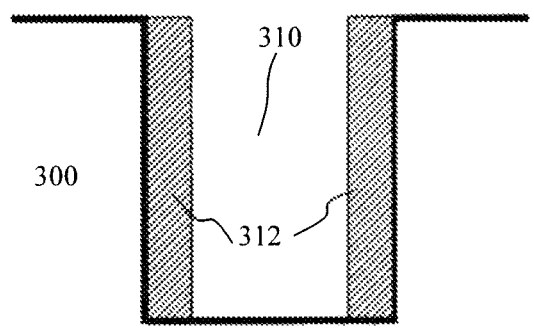
Figure 3C:
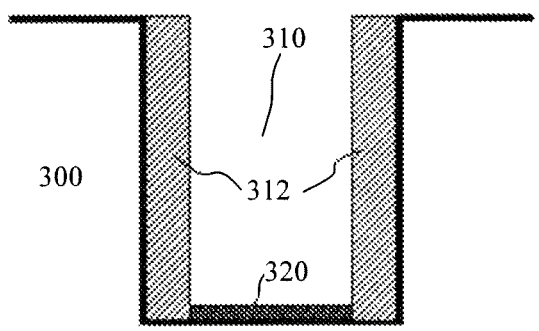
Figure 3D:
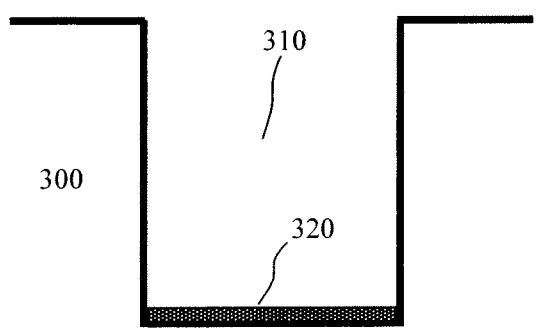
Figure 3E:
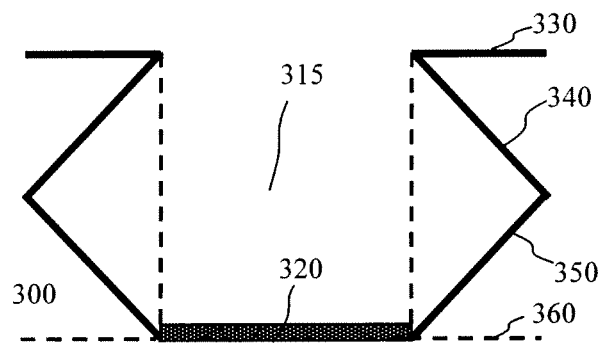
Figure 4:
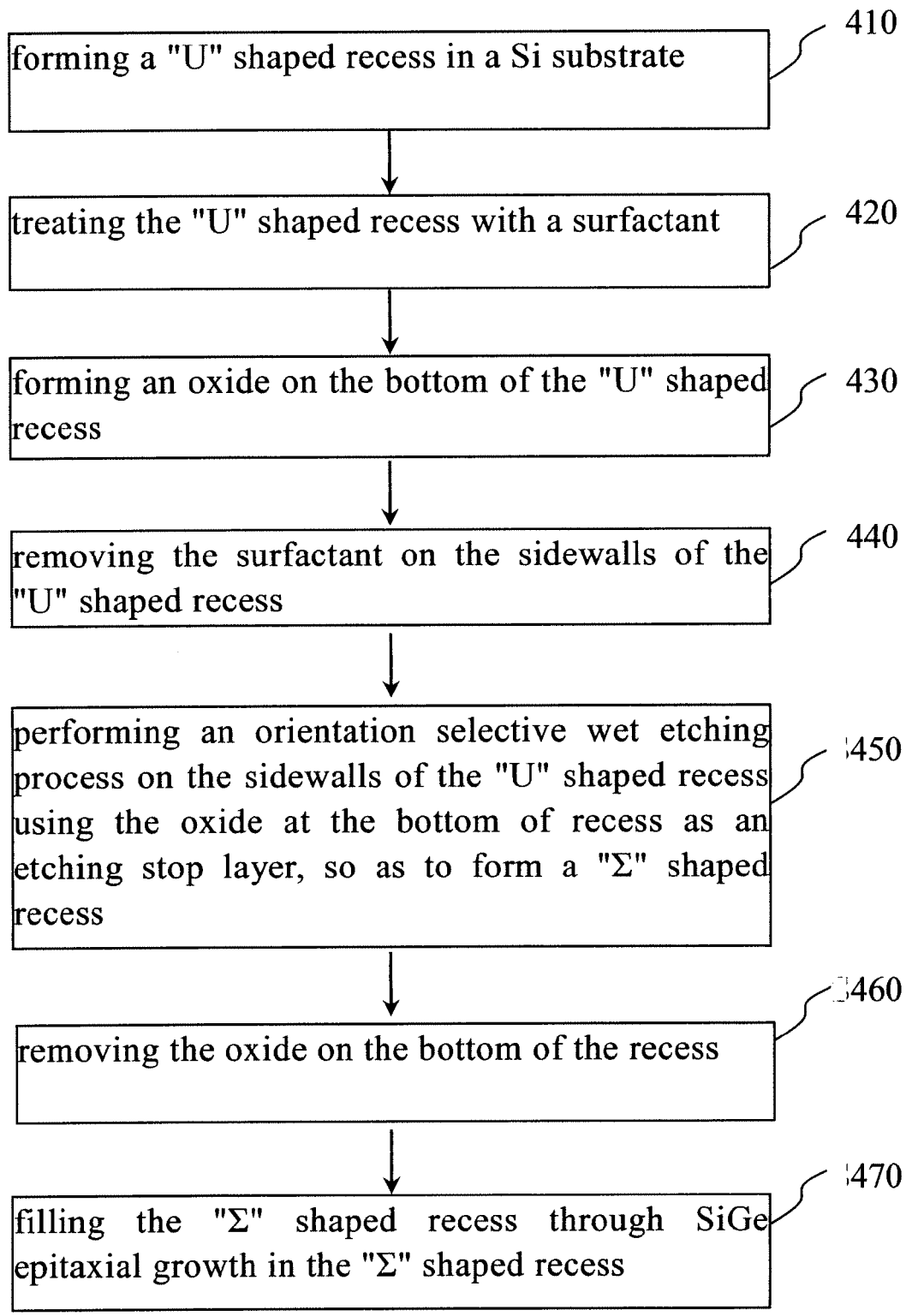
FIG. 4 is a flowchart of a method of fabricating the semiconductor device according to this invention.

First, at step 410, a "U" shaped recess 310 is formed in a substrate 300 as shown in FIG. 3A. The material of the substrate 300 can be, for example, Si.

For example, the "U" shaped recess 310 can be formed through a well-known dry etching process.

The substrate 300 can be etched using a gate and gate sidewall spacer (both are not shown) formed thereon as a mask to form the "U" shaped recess 310.

The depth of the "U" shaped recess 310 can be determined by the expected depth of the source/drain regions.

The bottom of the "U" shaped recess 310 can be substantially parallel to the substrate surface. The sidewalls of the "U" shaped recess 310 can be substantially vertical to the substrate surface.

The substrate surface and sidewalls of the "U" shaped recess can have substantially any crystal plane orientation among {100} and {110} crystal plane families, respectively.

For example, when the substrate surface has the (001) crystal plane orientation, the sidewalls of the "U" shaped recess may have the (110) plane orientation. Considering that crystal surfaces that are commonly used presently have the (001) crystal plane orientation, it is more convenient to set the crystal plane orientation of the substrate surface to (001).

When the channel orientation is selected as the <110> crystal orientation to obtain a greater carrier mobility, the sidewalls of the "U" shaped recess may substantially have the (110) or (1$\bar{1}$0) crystal plane orientations.

By way of example, in the following description, the crystal plane orientation of the substrate surface is set to (001), and the crystal plane orientation of the sidewalls of the "U" shaped recess is set to (110) or (1$\bar{1}$0). However, those skilled in the art will appreciate that, for other plane orientation designs, a method similar or identical to that of the present invention also can be adopted.

If the substrate surface is selected to have the (001) plane orientation, when referring to "(11x) crystal surface", it is meant to encompass (11x) and (1$\bar{1}$x) crystal surfaces, wherein the "x" denotes "0" "1" or "$\bar{1}$".

Next, at step 420, the "U" shaped recess is treated with a surfactant, such that the amount of surfactant adsorbed on the sidewalls of the "U" shaped recess is larger than that adsorbed on the bottom of the "U" shaped recess.

The step of treating the "U" shaped recess with a surfactant may comprise: covering the sidewalls and bottom of the "U" shaped recess with the surfactant and removing the surfactant covering the sidewalls and bottom of the "U" shaped recess with a cleaning agent. After such treatment, the amount of surfactant retained on the sidewalls of the "U" shaped recess is larger than that on the bottom of the "U" shaped recess due to the adsorption effect.

The surfactant, Triton X-100 $(C_{14}H_{22}O(C_2H_4O)_n$, n=9~10) of 1% volume concentration can be used. Triton X-100 has very high adsorption selectivity on {110} and {100} planes, that is, the adsorption for Triton X-100 on the {110} plane is far stronger than that on the {100} plane.

Figure 5:
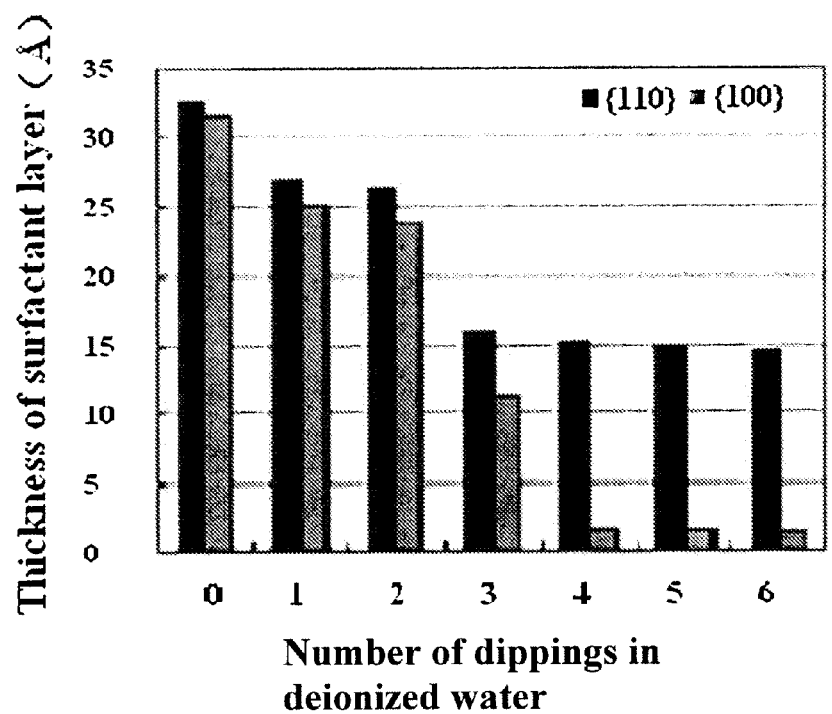
FIG. 5 is a graph showing the thickness of surfactant layer (Triton X-100) absorbed on the sidewalls and bottom of the "U" shaped recess as a function of the number of dippings in deionized water.

As the cleaning agent herein, deionized water can be used. FIG. 5 illustrates the thickness of Triton X-100 absorbed on the sidewalls and bottom of the "U" shaped recess (e.g., {110} surface and a {100} surface) as a function of the number of subsequent dippings in deionized water. As an example, as shown in FIG. 5, in the case that the {100} orientation bottom and the {110} orientation sidewalls are initially covered with surfactant of more than 30 Å respectively, dipping four times in deionized water for cleaning can provide a Triton X-100 film of about 15 Å retained on the {110} surface due to the adsorption effect while a Triton X-100 film of about 0 Å remains adsorbed on the {100} surface.

Next, at step 430, an oxide is formed on the bottom of the "U" shaped recess, wherein the surfactant adsorbed on the sidewalls of the "U" shaped recess prevents the oxide from being formed on the sidewalls.

The oxide, such as $SiO_2$, can be obtained through treating the Si substrate with peroxide or low concentration ozone water. The peroxide may be SC1 composed of ammonia, hydrogen peroxide and deionized water with a volume ratio of 1:2:50, wherein the mass concentration of ammonia is 29% and the mass concentration of hydrogen peroxide is 31%.

Preferably, the oxide on the bottom of the "U" shaped recess can be formed to be very thin, for example, merely 4-5 Å.

Due to the presence of relative thick surfactant on the sidewalls of the "U" shaped recess, there is substantially no oxide formed on the sidewalls.

Next, before a wet etching process described hereinafter, the surfactant on the sidewalls of the "U" shaped recess is removed by means of a cleaning agent at step 440.

Optionally, NMP can be used as a cleaning agent for removing Triton X-100, at a processing temperature of 60-80° C.

Then, at step 450, using the oxide at the bottom of recess as an etching stop layer, an orientation selective wet etching process is performed on the sidewalls of the "U" shaped recess 310 with an etchant, which has a higher etch rate with respect to Si as compared to the oxide.

Orientation selective wet etching processes are well known in the art. For example, the etch rate on the <111> plane orientation may be lower than that on other orientations.

Figure 3F:
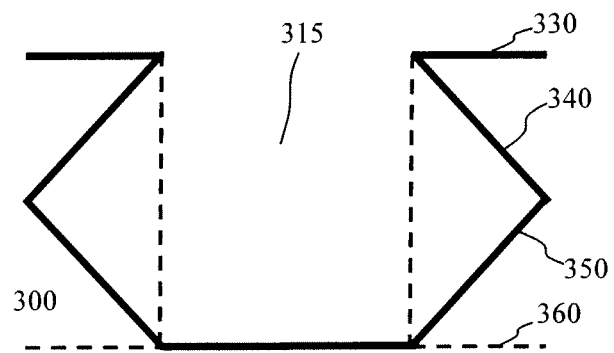

Thus, the wet etching will terminate on the (111) and (11$\bar{1}$) crystal planes, forming a "Σ" shaped recess 315 as shown in FIG. 3F. As shown in FIG. 3F, a "Σ" shape is formed from the surface 330 of substrate 300, the upper portion 340 and the lower portion 350 of the recess sidewall and the extended line 360 (denoted by a dashed line) of the recess bottom.

Those skilled in the art should appreciate that the etchant used herein can be selected from various available etchants. Table 1 below lists the etch rates of Si and hard masks $Si_3N_4$, $SiO_2$, etch selectivity between different crystal planes of Si, and advantages and disadvantages as a function of the etchant.

TABLE 1

| Etchant | Etch rate ratio | | Etch rate (absolute) | | | Advantages (+) |
| --- | --- | --- | --- | --- | --- | --- |
| | (100)/(111) | (110)/(111) | (100) | $Si_3N_4$ | $SiO_2$ | Disadvantages (−) |
| KOH (44%, 85□) | 300 | 600 | 1.4 μm/min | <1 Å/min | 14 Å/min | (−) metal ion containing (+) strongly anisotropic |
| TMAH (25%, 80□) | 37 | 68 | 0.3-1 μm/min | <1 Å/min | 2 Å/min | (−) weak anisotropy (+) metal ion free |
| EDP (115□) | 20 | 10 | 1.25 μm/min | 1 Å/min | 2 Å/min | (−) weak anisotropy, toxic (+) metal ion free, metallic hard masks possible |

Preferably, TMAH can be used for the orientation selective wet etching, and the etching time can be 30 s-3 mins, the processing temperature can be 25-60° C. Table 2 below illustrates the results of etching Si and the oxide by means of TMAH (volume concentration of 2.38%). TMAH has a far lower etch rate with respect to the oxide as compared to Si. For example, as shown in Table 2, the etch rate of TMAH 2.38% (30° C.) with respect to the oxide is approximate to 0 Å/min, while the etch rate with respect to poly-Si is about 100 Å/min.

TABLE 2

| | TMAH (30° C.) | TMAH (40° C.) | TMAH (50° C.) | TMAH (70° C.) |
| --- | --- | --- | --- | --- |
| Poly Si | 95 Å/min | 225 Å/min | 450 Å/min | 3000 Å/min |
| Oxide | <1 Å/min | <1 Å/min | <1 Å/min | <1 Å/min |

Therefore, the oxide 320 at the bottom of the "U" shaped recess can be used as a etching stop layer in the wet etching process to prevent the Si covered by the oxide 320 from being etched, so that the sidewalls that are not covered by the SiGe layer are etched to form a "Σ" shape.

Thus, a "Σ" shaped recess 315 with a substantially flat bottom is formed. Due to the presence of the oxide 320, the Si at the bottom of the "U" shaped recess 310 can be protected from being etched, therefore overcoming the technical problem of forming a cuspate bottom in prior art.

After wet etching, at step 460, the oxide on the bottom of the "U" shaped recess is removed using a cleaning agent, the processing time can be 20 s-2 min, and the processing temperature can be room temperature.

The cleaning agent used herein can be diluted HF (HF: $H_2O$=1:100~1:500).

Figure 3G:
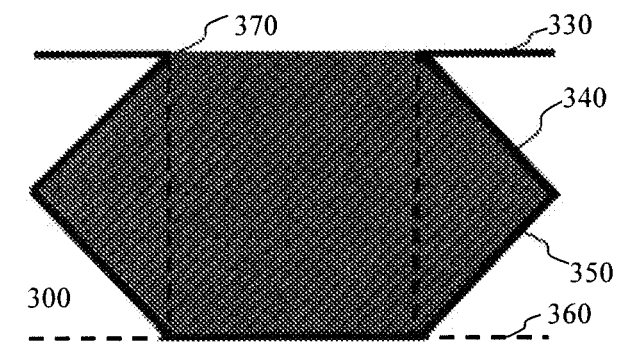

Then, as shown in FIG. 3G, the "Σ" shaped recess 315 is filled through epitaxially growing SiGe 370 in the "Σ" shaped recess 315.

The SiGe filled in the "Σ" shaped recess 315 is used to form a source or drain region for the PMOS device.

FIG. 3G schematically illustrates the "Σ" shaped SiGe source/drain region structure of a semiconductor device fabricated according to a method incorporating features of the invention.

As shown in FIG. 3G, a recess formed in the Si substrate of the semiconductor device is filled with SiGe material. The SiGe material filled therein is used to form a source or drain region for a PMOS device.

Thus, the method of fabricating a semiconductor device as well as the semiconductor device formed by such a method have been described in detail. Some details that are well known in the art are not discussed for the purpose of not obscuring the concept of this invention. With the above description, those skilled in the art can thoroughly understand how to implement the technique solutions disclosed herein.

Although some specific embodiments of this invention have been illustrated in detail by way of examples, those skilled in the art will appreciate that the above examples are merely illustrative and are not intended to limit the scope of this invention. It should be understood by a person skilled in the art that the above embodiments can be modified without departing from the scope and spirit of the present invention. The scope of the present invention is defined by the attached claims.

What is claimed is:

1. A method of fabricating a semiconductor device, comprising:
    forming a substantially "U" shaped recess in a Si substrate;
    treating the "U" shaped recess with a surfactant, wherein an amount of surfactant adsorbed on sidewalls of the "U" shaped recess is larger than an amount adsorbed on a bottom of the "U" shaped recess;
    forming an oxide on the bottom of the "U" shaped recess, wherein the surfactant adsorbed on the sidewalls of the "U" shaped recess prevents the oxide from being formed on the sidewalls;
    removing the surfactant on the sidewalls of the "U" shaped recess using a first cleaning agent;
    performing orientation selective wet etching on the sidewalls of the "U" shaped recess with an etchant using the oxide as an etching stop layer, so as to form a "Σ" shaped recess; and
    removing the oxide on the bottom of the "U" shaped recess using a second cleaning agent.

2. The method according to claim 1, wherein the step of treating the "U" shaped recess with a surfactant comprises: covering the sidewalls and bottom of the "U" shaped recess with the surfactant; and removing a portion of the surfactant covering the sidewalls and bottom of the "U" shaped recess with a third cleaning agent.

3. The method according to claim 1, wherein the surfactant comprises Triton X-100.

4. The method according to claim 2, wherein the third cleaning agent comprises deionized water.

5. The method according to claim 1, wherein the oxide is obtained through treating the Si substrate with peroxide or low concentration ozone water.

6. The method according to claim 5, wherein the peroxide is composed of ammonia, hydrogen peroxide and deionized water with a volume ratio of 1:2:50, wherein the mass concentration of ammonia is 29% and the mass concentration of hydrogen peroxide is 31%.

7. The method according to claim 1, wherein the first cleaning agent comprises N-methyl-2-pyrrolidone.

8. The method according to claim 1, wherein the etchant has a higher etch rate with respect to Si as compared to the oxide.

9. The method according to claim 8, wherein the etchant comprises tetramethylammonium hydroxide.

10. The method according to claim 1, wherein the second cleaning agent comprises diluted HF.

11. The method according to claim 1, further comprising:
    filling the "Σ" shaped recess through SiGe epitaxial growth in the "Σ" shaped recess.

12. The method according to claim 11, wherein the SiGe filled in the "Σ" shaped recess is used to form a source or drain region of a PMOS device.

13. The method according to claim 1, wherein either of the plane orientations of the substrate surface and the sidewalls of the "U" shaped recess is substantially one of two crystal planes substantially orthogonal to each other among {100} and {110} crystal plane families, and in the orientation selective wet etching, the etch rate on the <100> orientation is lower than that on other orientations.

14. The method according to claim 13, wherein the substrate surface has (001) plane orientation, and the sidewalls of the "U" shaped recess has (110) plane orientation.

* * * * *